(12) United States Patent
Marr et al.

(10) Patent No.: US 11,189,536 B2
(45) Date of Patent: Nov. 30, 2021

(54) METHOD AND APPARATUS FOR ON-CHIP STRESS DETECTION

(71) Applicant: Micron Technology, Inc., Boise, ID (US)

(72) Inventors: Kenneth William Marr, Boise, ID (US); Chiara Cerafogli, Boise, ID (US); Michele Piccardi, Cupertino, CA (US); Marco-Domenico Tiburzi, Avezzano (IT); Eric Higgins Freeman, Boise, ID (US); Joshua Daniel Tomayer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 316 days.

(21) Appl. No.: 16/294,469

(22) Filed: Mar. 6, 2019

(65) Prior Publication Data

US 2020/0211914 A1    Jul. 2, 2020

Related U.S. Application Data

(60) Provisional application No. 62/786,762, filed on Dec. 31, 2018.

(51) Int. Cl.
*H01L 21/66* (2006.01)
*G01B 7/16* (2006.01)

(52) U.S. Cl.
CPC ............ *H01L 22/34* (2013.01); *G01B 7/18* (2013.01)

(58) Field of Classification Search
CPC ................................. H01L 22/34; G01B 7/18
See application file for complete search history.

(56) References Cited

U.S. PATENT DOCUMENTS 3,182,492 A * 5/1965 Sikorski .................... G01L 1/18
                                                              73/777
3,965,453 A * 6/1976 Seidel ................. H01L 27/0802
                                                              338/13
(Continued)

FOREIGN PATENT DOCUMENTS

TW         201533435         9/2015
TW         202041838         11/2020
(Continued)

OTHER PUBLICATIONS

"International Application Serial No. PCT US2019 067609, International Search Report dated Apr. 24, 2020", 3 pgs.
(Continued)

*Primary Examiner* — Lisa M Caputo
*Assistant Examiner* — Philip L Cotey
(74) *Attorney, Agent, or Firm* — Schwegman Lundberg & Woessner, P.A.

(57) ABSTRACT

A microelectronic chip device includes a semiconductor substrate and multiple on-chip strain sensors (OCSSs) constructed on the substrate at various locations of the substrate. The OCSSs may each include multiple piezoresistive devices configured to sense a strain at a location of the various locations and produce a strain signal representing the strain at that location. A strain measurement circuit may also be constructed on the semiconductor substrate and configured to measure strain parameters from the strain signals produced by the OCSSs. The strain parameters represent the strains at the various location. Values of the strain parameters can be used for analysis of mechanical stress on the chip device.

25 Claims, 8 Drawing Sheets

(56) References Cited

U.S. PATENT DOCUMENTS

| | | | |
|---|---|---|---|
| 6,532,824 B1 | 3/2003 | Ueno et al. | |
| 7,430,921 B2* | 10/2008 | Ohta | G01L 1/18 73/777 |
| 7,770,462 B2* | 8/2010 | Ohta | G01L 1/18 73/777 |
| 2006/0030062 A1 | 2/2006 | He et al. | |
| 2006/0043508 A1* | 3/2006 | Ohta | G01L 1/18 257/417 |
| 2007/0018655 A1* | 1/2007 | Ausserlechner | H01L 43/04 324/501 |
| 2007/0151356 A1* | 7/2007 | Sumigawa | G01B 7/18 73/777 |
| 2008/0034882 A1* | 2/2008 | Ohta | F16K 37/0083 73/777 |
| 2008/0289432 A1* | 11/2008 | Ohta | G01L 1/18 73/777 |
| 2008/0290414 A1* | 11/2008 | Xiong | H01L 21/823807 257/348 |
| 2009/0058443 A1* | 3/2009 | Ohashi | G01R 31/2856 324/750.05 |
| 2009/0108839 A1* | 4/2009 | Ausserlechner | H01L 27/22 324/251 |
| 2012/0210800 A1 | 8/2012 | Huber et al. | |
| 2014/0306623 A1* | 10/2014 | Caffee | G01P 15/097 318/116 |
| 2018/0141805 A1* | 5/2018 | Teo | G01D 18/00 |
| 2018/0145629 A1* | 5/2018 | Yamamoto | H03B 5/20 |
| 2018/0231424 A1 | 8/2018 | Nurmetov et al. | |

FOREIGN PATENT DOCUMENTS

| | | |
|---|---|---|
| WO | 2009142630 | 11/2009 |
| WO | 2020142241 | 7/2020 |

OTHER PUBLICATIONS

"International Application Serial No. PCT US2019 067609, Written Opinion dated Apr. 24, 2020", 7 pgs.

"Taiwanese Application Serial No. 108143861, Office Action dated Sep. 29, 2020", w English Translation, 19 pgs.

"Taiwanese Application Serial No. 108143861, Response filed Jan. 5, 2021 to Office Action dated Sep. 29, 2020", w English Claims, 44 pgs.

"Taiwanese Application Serial No. 108143861, Decision of Rejection dated Jun. 2, 2021", w English translation, 15 pgs.

* cited by examiner

METHOD AND APPARATUS FOR ON-CHIP STRESS DETECTION

CLAIM OF PRIORITY

This application claims the benefit of priority under 35 U.S.C. § 119(e) of U.S. Provisional Patent Application Ser. No. 62/786,762, filed on Dec. 31, 2018, which is incorporated by reference in its entirety.

BACKGROUND

Mechanical stresses develop on dies during manufacturing of integrated circuit (IC) devices. Such mechanical stresses can affect performance of an IC device when being used in electronic devices. The performance can deteriorate to a point of device failure when the IC device experiences an intolerable amount of mechanical stresses, which, for example, causes parametric shifts beyond specification. Mechanical forces, as well as other factors such as electricity, heat, chemical substances, and/or radiation, when applied to an IC device during its fabrication, assembly, and packaging can result in various degrees of mechanical strains and stresses on the die. Therefore, such factors, which may result from normal manufacturing processes and abnormal conditions including IC design faults, contribute to various mechanisms leading to device failure. Models have been developed for predicting such device failures based on analysis of these factors, among other things. However, such models cannot account for actual events and conditions experienced by a specific IC device, and therefor can only estimate a probability of eventual failure of that IC device.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
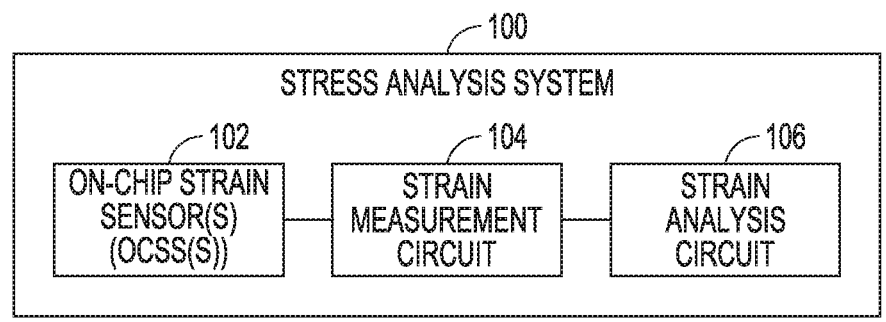
FIG. 1 is a block diagram illustrating an embodiment of a system for analyzing mechanical stress on a microelectronic chip device using one or more on-chip strain sensors (OCSSs).

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document discusses, among other things, a system and method for stress detection in an integrated circuit (IC) device using one or more on-chip strain sensors (OCSSs). Various other techniques have allowed for analysis of effects of mechanical stresses on performance of an IC device based on model-based simulations and/or indirect measurements such as using semiconductor chip strain sensors. The present subject matter allows for direct measurement of mechanical stresses on actual IC dies using the OCSSs. Such direct measurement can be performed during manufacturing, including process and package, as well as application of the manufactured devices. The "process" can include wafer-fabrication factors and processes. The OCSSs can be used to provide a High-Volume Manufacturing (HVM) electrical proxy for film-stress, which relates to film thickness and film properties, to close gap and to identify reliability lessons such as cracking or delamination. The "package" can include any form-factor that is not a wafer. The OCSSs can be used to provide an HVM electrical proxy for yield issues related to film-stack-stresses that result in device abnormalities such as warpage and deformation. Such stresses can be associated with the type of packaging; the packaging materials and their properties; and the use of spacers, voids, and ingresses, etc. The OCSSs can be used in a method for evaluating simulation to silicon for CMOS under array for concerns of mobility variations due to the stress. In various embodiments, the OCSSs can be strategically distributed on each die depending on the anticipated stress distribution. In various embodiments, the stresses are detected based on changes in resistances of the OCSSs in various forms such as changes in response to a changing level of stress (e.g., before and after application or formation of the stress) and/or changes from one location to another on the same die.

The present subject matter can, for example, provide HVM data to quantify electrical variations identified after mechanical and/or thermal stresses modify characteristics of silicon for taking actions accordingly, provide HVM data on spatial stress component to eliminate requirements of physical die inspection (e.g., Shadow Moiré method for package warpage measurement), and/or provide information of electrical effects due to mechanical and thermal stresses silicon is subjected to. The OCSSs can be used to characterize relative stress and strain on each die for identifying lowest-risk solutions and preventive actions more quickly, thereby reducing development cycle time. The OCSSs can be used to collect electrical empirical data representing effects of mechanical and/or thermal stresses on each die, and provide an HVM measurable on the quality and reliability of the final IC device product. The OCSSs can be used to close gap for customer returns and to speed-up issue identification and provide feedbacks for preventive actions. Incorporating one or more OCSSs into each die does not require special fabrication techniques. Measurements using an OCSS is not destructive. Performing OCSS-based measurements on every die is fast enough and feasible for use in HVM.

The present subject matter can also provide for on-chip measurements of OCSS-sensed signals (i.e., resistance changes) using a circuit functioning as a high relative-precision on-chip digital ohmmeter and designed for manufacturing, reliability, and test. The measured data can be used for predictive controls for quality and reliability issues relating to the process and package.

FIG. 1 is a block diagram illustrating an embodiment of a stress analysis system 100 for analyzing mechanical stress on a microelectronic device using one or more OCSSs 102. OCSSs 102 are each built on a substrate of the microelectronic chip device. For clarity of the following discussion, unless expressly indicated otherwise by either language or context, the term "substrate" is used herein to identify the base substrate, such as a semiconductor substrate; and the term "substrate assembly" is used herein to identify the semiconductor substrate with additional structures formed thereon, as required to form, for example, a semiconductor device. As a result, an OCSS "built on" or "constructed on" a substrate may be formed: at least in part within the dimensions of the semiconductor substrate itself (for example, in doped regions within the semiconductor substrate) or alternatively may be formed at least partially in material layers formed over the semiconductor substrate. For example, components of a first OCSS may be formed at least partially within doped regions within a substrate, and partially within materials formed over the substrate; and one or more additional OCSSs may be formed entirely in layers disposed outwardly from the semiconductor substrate. All such OCSSs are "built on" or "constructed on" the substrate in accordance with the description herein.

In various embodiments, the microelectronic device includes an IC chip with microelectronic including OCSSs 102. In various embodiments, OCSSs 102 include a plurality of OCSSs distributed on the chip to reduce noise in strain measurements. Such noise may be associated with uneven distribution of various factors on the chip during the manufacturing process, such as voltage and temperature distributions. OCSSs 102 can each sense a strain on a portion of the chip and produce a strain signal representing the strain.

In various embodiments, OCSSs 102 can each sense the strain signal using a piezoresistive effect. The piezoresistive effect includes a change in the electrical resistivity of a semiconductor or metal structure in response to a mechanical stress applied to the structure. The piezoresistive effect of semiconductors, including but not limited to germanium, polycrystalline silicon, amorphous silicon, and single crystal silicon, is used for sensing strains. Use of such semiconductors in IC chips allows for integration of strain sensors into various microelectronic circuit devices. The simplest form of piezoresistive devices include piezoresistors, which can be made from a variety of piezoresistive materials and can be used for sensing mechanical strain. An example of piezoresistive silicon sensors includes a piezoresistor, which consists of a simple two contact diffused N− or P− wells within a P- or N-substrate. Additional P+ or N+ plus diffusions are potentially used to facilitate ohmic contacts to the device. Change in resistance caused by deformation of the piezoresistor under mechanical stress can be measured using a Wheatstone bridge and is related to the strain by the gauge factor. While piezoresistive devices are specifically discussed as an example, any device suitable to be integrated into the IC chip and capable of producing a measurable signal indicative of a mechanical stress applied to the device can be used as the OCSS discussed in this document.

OCSSs 102 can each include one or more piezoresistive devices. In some embodiments, OCSSs 102 each include multiple piezoresistive devices, which can include different types of piezoresistive devices. A multiplexer can be coupled to the multiple piezoresistive devices to allow for resistance reading from one or more piezoresistive devices of the multiple piezoresistive devices in the ( )SS at a time. This provides for consistency in strain measurements while reducing overall size of measurement circuitry on the chip. Examples of various types of piezoresistive devices used for OCSSs 102 include:

a metal resistor (also known as metal film resistor), which uses metal film as the resistive element that has a resistance that changes in response to the length of the metal film;

a silicon resistor, which uses silicon semiconductor material as the resistive element, such as:
complementary metal-oxide semiconductor (CMOS) resistor, including CMOS transistors used as resistors;
N-type resistor and P-type resistor, including N-type polysilicon resistor (poly resistor), P-type polysilicon resistor, N-type diffusion resistor, P-type diffusion resistor, N+ resistor, N− resistor, P+ resistor, P− resistor, and a pair of N-type and P-type resistors having opposing responses to both tensile and compressive forces; and
resistor formed using lightly-doped-drain (LDD), rather than source-drain (SD) implants, for the resistor with no special fabrication methods; and a metal silicide resistor (or silicide resistor), in which the silicide is formed by reacting a metal with silicon for the piezoresistive properties of silicon.

The above types are provided as examples for illustrative but not restrictive purposes, and are not intended to be an exhaustive list of possible types of piezoresistive devices used for OCSSs 102.

Stress analysis system 100 can include a strain measurement circuit 104 coupled to OCSSs 102. Strain measurement circuit 104 can represent one or more strain measurement circuits each configured to measure the strain signal(s) produced by OCSSs 102. In one embodiment, a strain measurement circuit is coupled to each OCSS to measure the strain signal produced by that OCSS. In another embodiment, a strain measurement circuit is coupled to a multiple OCSSs through a multiplexer, to allow for measurement of the strain signals sensed by the OCSSs one at a time.

Strain measurement circuit 104 can electrically measure a mechanical strain on the chip using the strain signal produced by an OCSS to represent that mechanical strain. When an OCSS includes multiple piezoresistive devices, strain measurement circuit 104 can measure the strains each sensed by one or a combination of the piezoresistive devices, one at a time, through a multiplexer (e.g., built within the OCSS). Strain measurement circuit 104 can receive the strain signal from an OCSS and measure a strain parameter using the strain signal. The strain parameter is representative of the strain sensed by the OCSS. In various embodiments, the strain parameter can be a frequency representing the strain or a voltage representing the strain, as further discussed with references to FIGS. 5-8 below. In various embodiments, strain measurement circuit 104 can perform a self-calibration. For example, when the strain parameter includes a frequency representing changes in the strain, the frequency may respond to change in strain or change in voltage. By applying two voltages and obtaining a response slope and interpolating to the nominal voltage, the frequency measurements can be calibrated for detecting only the change in strain.

Stress analysis system 100 can include a strain analysis circuit 106. Strain analysis circuit 106 can receive the strain parameters measured by strain measurement circuits 104 and perform an analysis of the mechanical stress on the chip by processing the strain parameters. In various embodiments, the analysis is based on the strain parameters sensed by OCSSs 102 placed in different locations on a die of the microelectronic device at different times (e.g., representing different conditions experiences by the die during different stages of manufacturing and/or usage). In other words, spatial and temporal distributions of mechanical strains sensed bye OCSSs 102 are used to analyze the mechanical stress experienced by the die. In various embodiments, the analysis can result in magnitude and/or distribution of the mechanical stress that provide for monitoring of conditions experienced by the die during its manufacturing and/or use, thereby allowing for detection and correction of conditions that may affect functionality and performance of the microelectronic device during its application.

Thus, strain measurement circuits 104 can measure strain parameters from each die using a plurality of OCSSs distributed in different locations on the die for strain analysis circuit 106 to analyze strains at the different locations. Examples of the different locations include:

locations along one or more edges of the die;
locations at one or more corners of the die;
locations surrounding a bonding pad;
locations surrounding a through-silicon via (TSV);
locations proximal to regions of material volume discontinuities boundaries between device structures and/or materials of substantially different mechanical properties), including:
locations proximal to regions of "large" material volume discontinuities (e.g.,a replacement-gate (R(i) 3D NAND has large quantities of tungsten which causes significant manufacturing tolerances; a second 3D NAND RG is regions of same composition but differing constructional/deposition conditions resulting in significant differences in material properties);
locations proximal to regions of "small" material volume discontinuities (e.g., stress effects from shallow trench isolation, i.e., oxide islands in crystalline silicon); and
locations proximal to regions of deliberate strain for performancereasons (e.g., strained silicon).

The various sensor locations discussed above and elsewhere in this document are specific examples, while one or more OCSSs can be placed in any location within a die. In various embodiments, the one or more OCSSs can be placed in any on-chip locations determined by those skilled in the art upon reading and understanding this document. Strain measurement circuits 104 can also measure a plurality of values for each strain parameter of the plurality of strain parameters at different measurement times for strain analysis circuit 106 to analyze strains at the same location measured at different times. Examples of values measured at the different measurement times include pre-packaging and post-packaging values, measured before and after the die is packaged, respectively;
tensile and compressive values, measured while tensile and compressive forces are applied to the die, respectively;
values measured at different temperatures;
pre-board-mount and post-board-mount values, measured before and after the IC is mounted on a printed circuit board (PCB), respectively;
values from multiple measurements in the same condition for noise cancellation; and
values from repeated measurements for accuracy proof.

In various embodiments, strain analysis circuit 106 can produce a temporal value change for each strain parameter and/or a value change associated with an event (e.g., a manufacturing step) for each strain parameter. In various embodiments, strain analysis circuit 106 can produce complementary values for each strain parameter. The complementary values are associated with complementary events including events when the die is subjected to opposite conditions, such as events causing the strain to change in opposite directions (of opposite polarities). For example, the complementary values can include tensile value and compressive value being values of the strain parameter when the OCSS is stretched and compressed, respectively. In various embodiments, strain analysis circuit 106 can produce a temperature-related value change for each parameter for analysis of issues related to temperature change (e.g., package warpage during board-mount leads to open connections).

Figure 2:
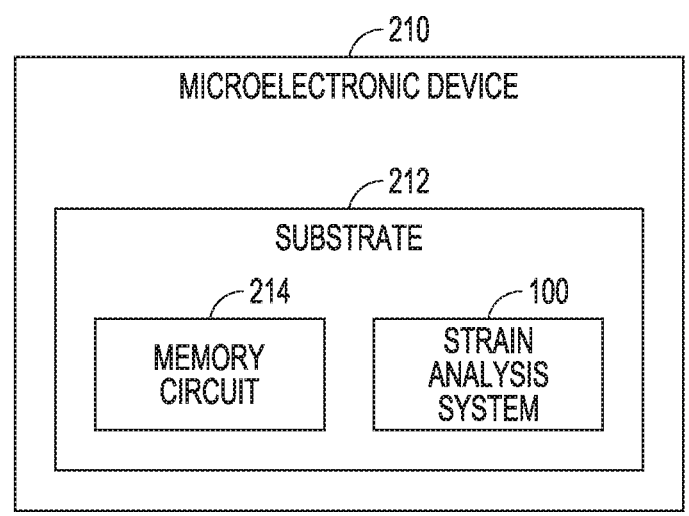
FIG. 2 is a block diagram illustrating an embodiment of a microelectronic device with a build-in stress analysis system, such as the system of FIG. 1.

FIG. 2 is a block diagram illustrating an embodiment of a microelectronic device 210 with a build-in stress analysis system, such as system 100. In the illustrated embodiment, microelectronic device 210 is an IC memory device that includes a memory circuit 214 and stress analysis system 100 built on a semiconductor substrate 212. An IC (also referred to as a chip) includes microelectronic components built on a semiconductor substrate (referred to as a wafer or a slice) and in the form of a die before packaging. In various embodiments, the IC can be provided in die form or in packaged form using any packaging techniques. While a memory device is illustrated in FIG. 2 as an example, the present subject matter can be applied in any IC.

In the illustrated embodiment, system 100 (including OCSS 102, strain measurement circuit 104, and strain analysis circuit 106 are entirely on-chip (i.e., built on substrate 212 and integrated with memory circuit 214). In other embodiments, strain analysis circuit 106 can be external to microelectronic device 210 and is to be communicatively coupled to microelectronic device 210 to receive the strain parameters. In some embodiments, strain measurement circuit 104 can also be external to microelectronic device 210 and is to be communicatively coupled to microelectronic device 210 to receive the strain signals.

Figure 3:
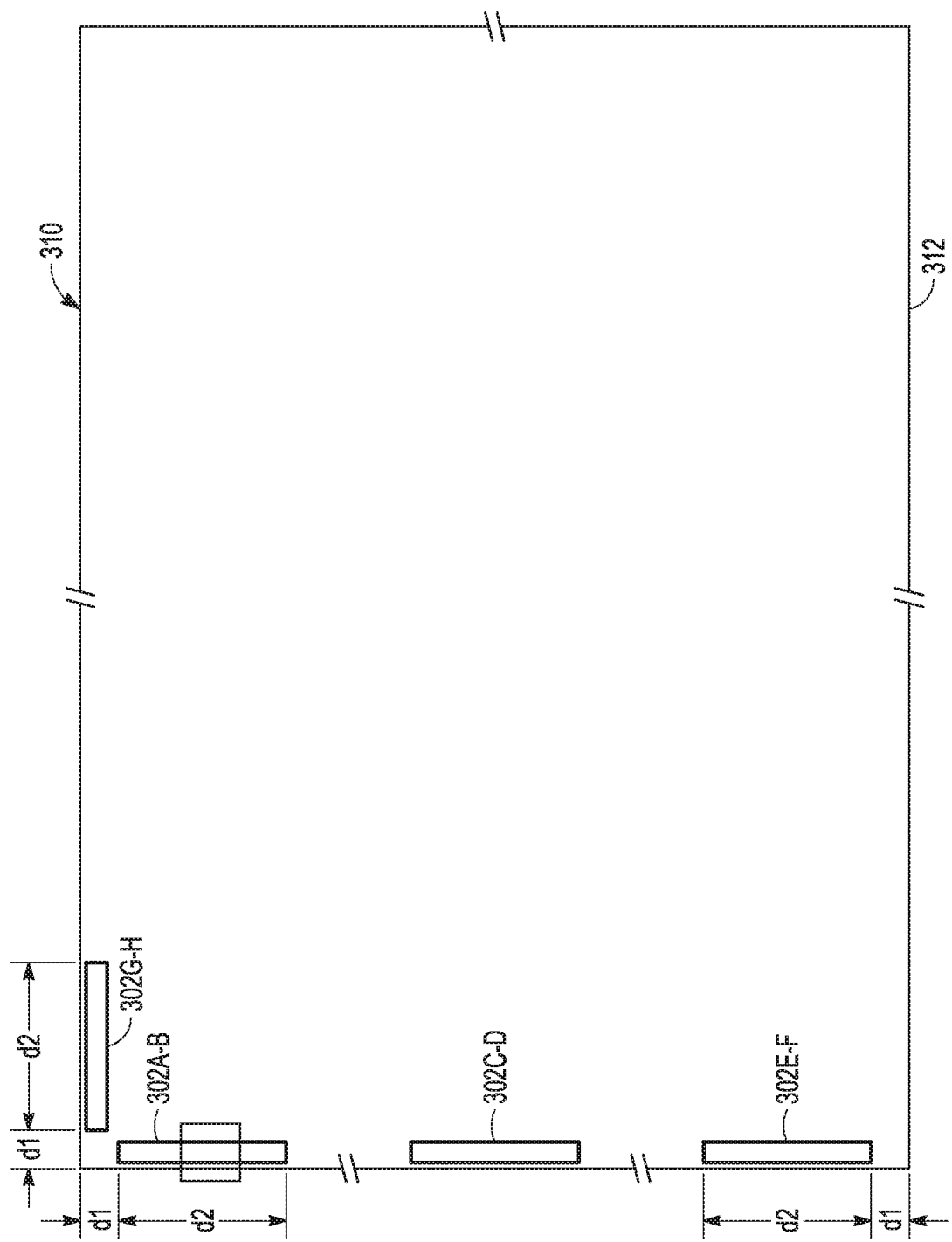
FIG. 3 is an illustration of an embodiment of OCSSs constructed on a semiconductor substrate structure, such as the substrate of the microelectronic device of FIG. 2.

FIG. 3 is an illustration of an embodiment of OCSSs 302 constructed on a semiconductor substrate 312 of a microelectronic device 310. Microelectronic device 310 can represent an example of microelectronic device 210, semiconductor substrate 312 can represent semiconductor substrate 212 or a substrate assembly including semiconductor substrate 212, and OCSSs 302 can present an example of OCSSs 102. FIG. 3 shows a specific example of locations of the OCSSs on a die.

Figure 4:
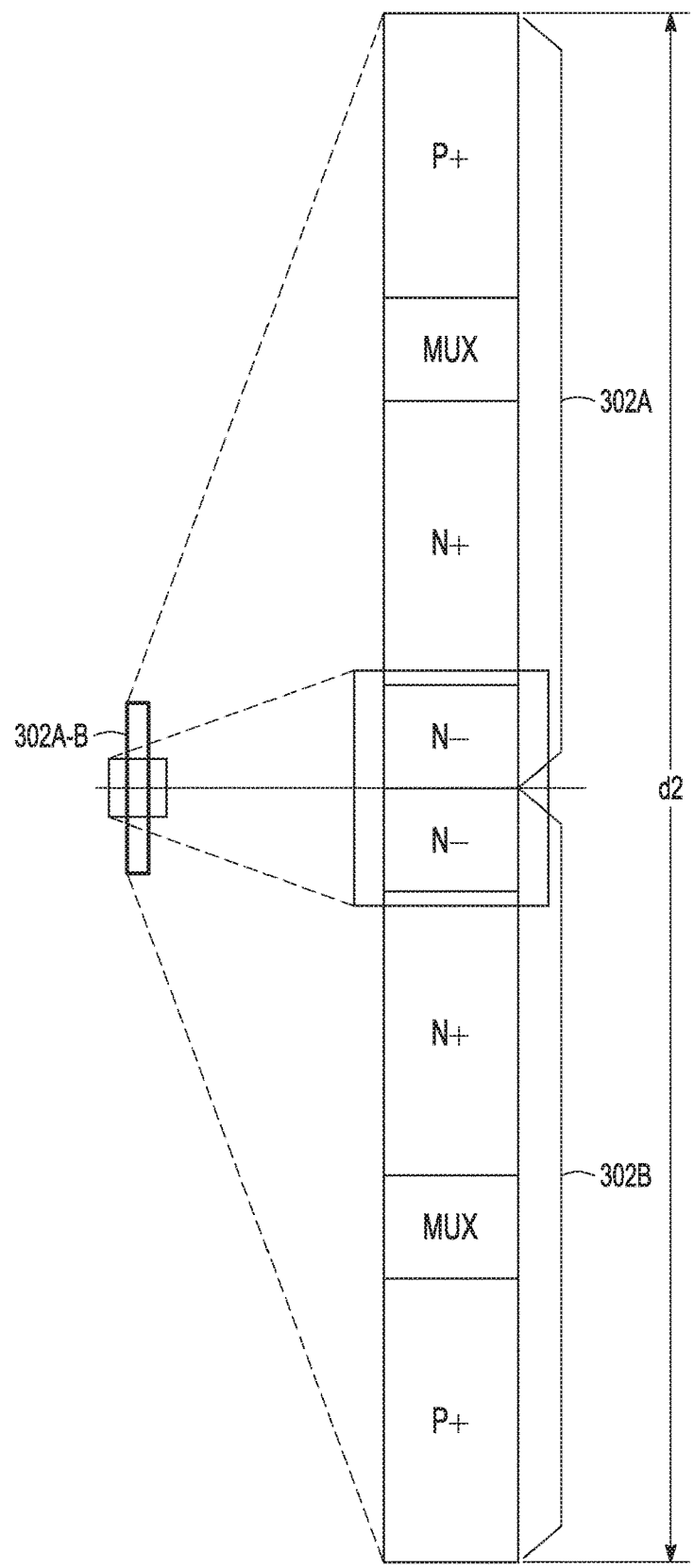
FIG. 4 is an illustration of an embodiment of a pair of OCSSs placed adjacent each other.

In the illustrated embodiment, semiconductor substrate 312 (and hence the die) has a rectangular shape having 4 edges (2 long edges and 2 short edges) and 4 corners. OCSSs 302 includes 8 OCSSs 302A-H placed in identical pairs of 2 sensors adjacent each other (i.e., 302A-B, 302C-D, 302E-F, and 302G-H). FIG. 4 is an illustration of an embodiment of a pair of OCSSs placed adjacent each other, with OCSSs 302A-B shown as an example. The "back-to-back" placement of OCSSs 302A-B provides for granularity improvements to better map strain in a defined area. Each of OCSSs 302A-H includes a P+ low-voltage (LV) resistor, an N+ LV resistor, an N− LV resistor, and a 2:1 multiplexer (MUX). The multiplexer allows for reading from the pair of P+ and N+ LV resistors at one time and from the N− LV resistor at another time. The pair of P+ and N+ LV resistors are sensed together to increase the voltage input, and the N− LV resistor is sense separately to enhance granularity.

Referring back to FIG. 3, OCSSs 302A-171 placed in locations where maximum strains are expected, at selected edges of the 4 edges to avoid impacting die size. As shown in FIG. 3, 6 OCSSs are distributed on a short edge of the 2 short edges and forming 3 groups each including 2 sensors adjacent each other. The 3 groups are placed at two opposite ends of the short edge and a center location of the short edge. The 2 remaining OCSSs are placed at an end of a long edge of the 2 long edges, with the end adjacent the short edge on which the other 6 sensors are placed. In a specific example, as illustrated in FIGS. 3 and 4 the total length of the 2 sensors adjacent each other (d2) is in a range of 500-700 μm, the long edge of the 2 sensors are placed as close to the edge of the substrate as possible, and the distance between the short edge of the 2 sensors to the edge of the substrate (d1) is longer than the short edge if the 2 sensors but within a range of 25-100 μm.

While FIGS. 3 and 4 illustrate a specific example of OCSS dimension and placement, an OCSS can be placed in any location on a die according to the present subject matter. The location can be determined based on design considerations including anticipated strain distribution on the die and impact on the overall die size. For example, a location may be determined for sensing a maximal strain anticipated for the die and/or for having no or minimal impact on the overall die size.

Figure 5:
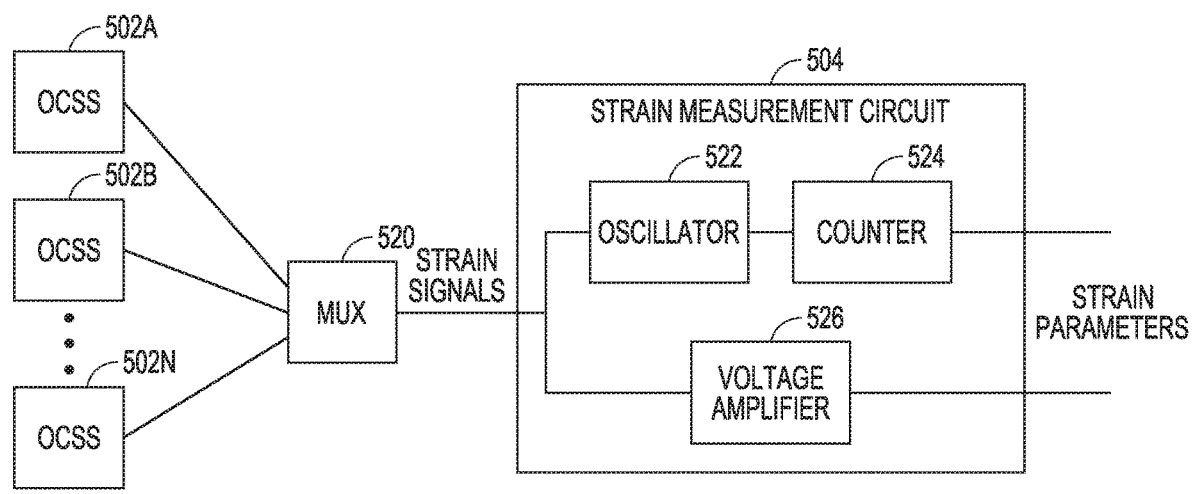
FIG. 5 is a block diagram illustrating an embodiment of a strain measurement circuit for measuring strain parameters from strain signals sensed by a plurality of OCSSs.

FIG. 5 is a block diagram illustrating an embodiment of a strain measurement circuit 504 for measuring strain parameters from strain signals sensed by a plurality of OCSSs 502 through a multiplexer (MUX) 520. In the illustrated embodiment, strain measurement circuit 504 includes an oscillator 522 and a counter 524 as a time-based strain measurement circuit for producing a frequency as the strain parameter and a voltage amplifier 526 as a voltage-based strain measurement circuit for producing a voltage as the strain parameter. In various embodiments, depending on the desired performance (e.g., measurement speed and accuracy), strain measurement circuit can include the time-based strain measurement circuit only, the voltage-based strain measurement circuit only, or both the time-based strain measurement circuit and the voltage-based strain measurement circuit.

To perform a time-based strain measurement with a frequency being the measured strain parameter, oscillator 522 (e.g., a current-controlled-oscillator) receives a strain signal from an OCSS and produces an oscillator signal having a frequency proportional to a current amplitude of the strain signal. Counter 524 measures the frequency of the oscillator signal. The time-based strain measurement may provide a more precise strain parameter when compared to the voltage-based strain measurement. For example, a resolution of 1 part-per-million (PPM) in the voltage-domain is 2 μV on 2 V target, while a resolution of 1 PPM in time-domain is 20 ns variation on 20 ms observation time. It is feasible to design strain measurement circuit 504 for a resolution better than 1 PPM, for example by using a 20 bit counter. In various embodiments, a desirable resolution can be achieved by choosing the right number of bits for counter 524.

In various embodiments, each OCSS can produce the strain signal as a local current used to charge and/or discharge a capacitor to generate a signal oscillating at a specified frequency target. A strain on the OCSS, such as resulting from thermal and/or mechanical stresses, results in a variation in characteristics of the OCSS, such as mobility and resistance value, thus producing variation in the amplitude of the strain signal. The strain signal modulates the frequency (or period) of the oscillating signal. Targeting, for example, a 20 ms period, 1 PPM oscillator variation results in a 0.00002 ns variation on each period. Integrating this variation into a sufficient timing window (i.e., 20 ms for 20 ns target period) and with the use of a 20-bit counter, the 1 PPM variation can result in a 1 bit error on the final counter output. In various embodiments, the desirable accuracy can be achieved by determining the period, the target window timeframe, and the number of bits required for the counter. In various embodiments, any current-controlled-oscillator configuration can be used to obtain the same result with a current based OCSS.

To perform a voltage-based strain measurement with a voltage being the measured strain parameter, voltage amplifier 526 receives a strain signal from an OSS and amplifies the strain signal. The voltage-based strain measurement may allow faster strain parameter measurement when compared to the time-based strain measurement. In one example, the voltage-based strain measurement is 95% faster than the time-based strain measurement (1 ms vs. 20 ms), and there is no need for a timing window.

In various embodiments in which the voltage-based strain measurement is performed, a proper combination of opposing responses (opposite polarity) of P-type and N-type piezoresistive devices to strains can be used to increase the amplitude of the strain signal produced by an OCSS, thereby providing for a better measurement accuracy. Using such combination of piezoresistive devices in an OCSS can introduce temperature gradient effects due to the different measurement environments before and after packaging. For example, the P-type and N-type piezoresistive devices respond in opposite directions to a strain but in the same direction to a temperature shift. In various embodiments, digital temperature compensation can be applied to improve the confidence on the measured strain parameters, and multiple measurements techniques can be applied for noise cancellation in the measured strain parameters.

Figure 6:
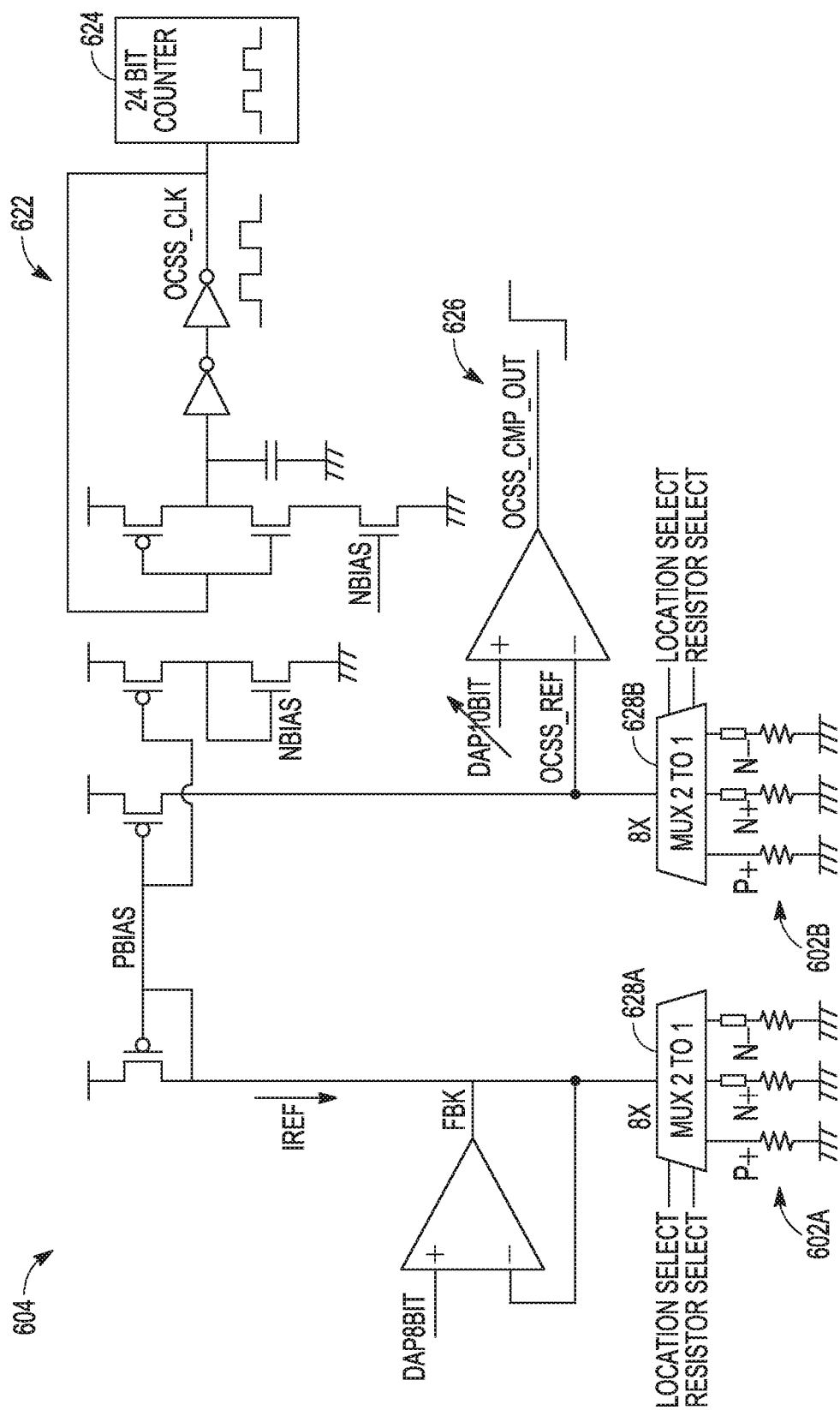
FIG. 6 is a circuit diagram illustrating an embodiment of the strain measurement circuit of FIG. 5.

FIG. 6 is a circuit diagram illustrating an embodiment of a strain measurement circuit 604 coupled to OCSSs 602A and 602B through multiplexers 628A and 628B. One of OCSSs 602A and 602B can be selected for strain measurement using "location select" (referring the OCSSs in different locations on the die), and a pair of P+ and N+ piezoresistors or an N− piezoresistor can be selected for strain measurement using "resistor select". Strain measurement circuit 604 can represent an example of strain measurement circuit 504 and include an oscillator 622 (representing an example of oscillator 522), a counter 624 (representing an example of counter 524), and a voltage amplifier 626 (representing an example of voltage amplifier 526). In various embodiments, other suitable oscillator, counter, and voltage amplifier circuits can be used and strain measurement circuit 604 may include only oscillator 622 and counter 624 to perform the time-based strain measurement, only voltage amplifier 626 to perform the voltage-based strain measurement, or oscillator 622 and counter 624 to perform the time-based strain measurement and voltage amplifier 626 to perform the voltage-based strain measurement.

Figure 7:
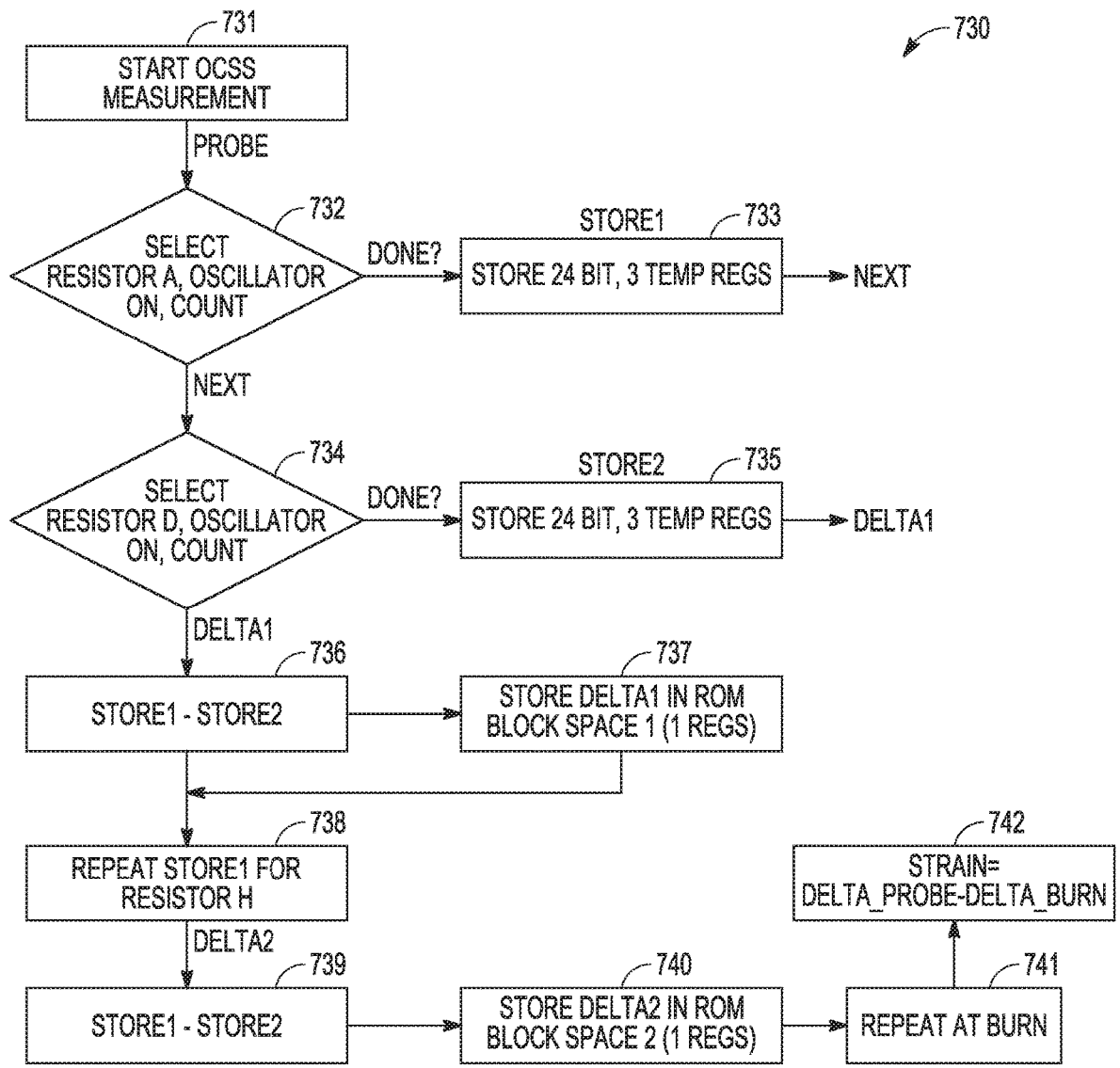
FIG. 7 is a flow chart illustrating an embodiment of a method for canceling temperature dependence in a time-based measurement and analysis of strain parameters.

FIG. 7 is a flow chart illustrating an embodiment of a method 730 for canceling temperature dependence in a time-based measurement and analysis of strain parameters. Strain is sensed using OCSSs at multiple locations to cancel temperature dependence, and the difference in the sensed strain (Delta) as measured using the same strain measurement circuit is stored at "probe" (when the dice are in wafer form, for a baseline value) and "burn" (when the dice are in packaged form).

At 731, an OCSS measurement process starts. The illustrated embodiment is an example of strain measurement during an IC chip manufacturing process, and the measurement process starts at "probe".

At 732, resistor A (representing OCSS at one location on the IC chip) is selected for strain measurement using an oscillator and a 24-bit counter according to the time-based measurement. At 733, the measured strain parameter (a 24-bit value) is stored as "Store1" using three 8-bit temporary registers.

At 734, resistor D (representing OCSS at another location on the IC chip) is selected for strain measurement using the oscillator and the 24-bit counter according to the time-based measurement. At 735, the measured strain parameter (a 24-bit value) is stored as "Store2" using three 8-bit temporary registers.

At 736, the difference "Delta 1" between Store 1 and Store2 is calculated to represent the difference between the strains sensed at the two different location on the IC chip. At 737, Delta1 is stored in ROM block space 1 (an 8-bit register).

At 738, measurement of Store1 is repeated for resistor H (representing OCSS at yet another location on the IC chip). At 739, the difference "Delta2" between Store1 (for resistor H) and Store2 is calculated to represent the difference between the strains sensed at the two different location on the IC chip. At 740, Delta2 is stored in ROM block space 2 (an 8-bit register).

At 741, the strain measurement steps 732-740 are repeated at "burn". At 742, the final strain reading is calculated as the different between the differences (deltas) measured at "probe" and the strains measured at "burn".

Figure 8:
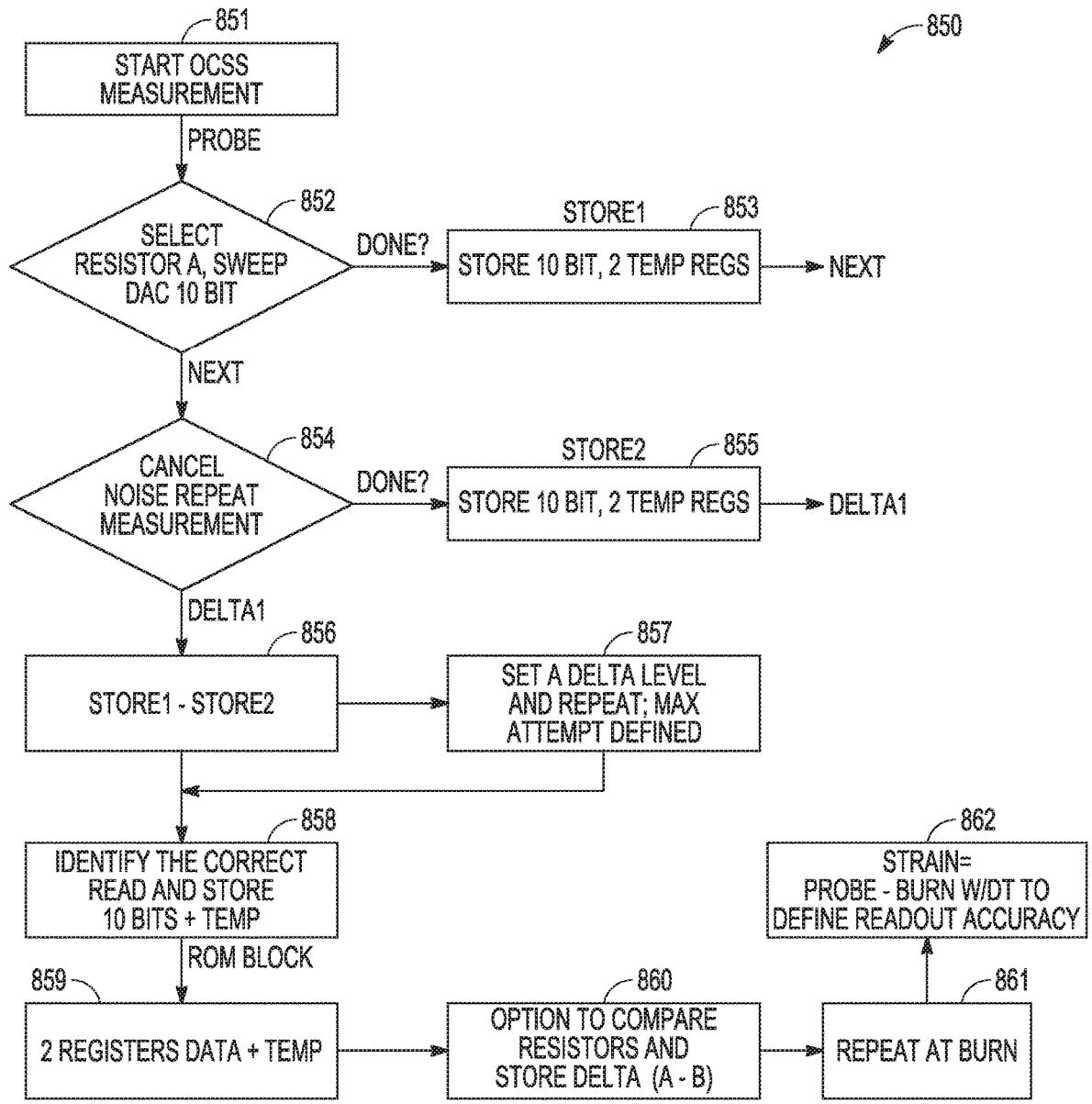
FIG. 8 is a flow chart illustrating an embodiment of a method for canceling temperature dependence in a voltage-based measurement and analysis of strain parameters.

FIG. 8 is a flow chart illustrating an embodiment of a method 850 for canceling random error in a voltage-based measurement and analysis of strain parameters. The difference in the sensed strain (Delta) as measured using the same strain measurement circuit is stored at "probe" and "burn".

At 851, an OCSS measurement process starts. The illustrated embodiment is an example of strain measurement during an IC chip manufacturing process, and the measurement process starts at "probe".

At 852, resistor A (representing OCSS at one location on the IC chip) is selected for strain measurement using a voltage amplifier according to the voltage-based measurement. At 853, the measured strain parameter (a 10-hit value) is stored as "Store1" using two 8-bit temporary registers.

At 854, the measurement at 852 is repeated for noise cancellation. At 855, the measured strain parameter (a 10-bit value) is stored as "Store2" using two 8-bit temporary registers.

At 856, the difference "Delta1" between Store1 and Store2 is calculated to represent the difference between the two measurements. At 857, a level of the difference (delta level) is set and the measurement and calculation for Delta1 repeats, with a maximum number of attempts specified.

At 858, the correct Delta1 read is identified and stored (10-bit value) with "Temp". At 859, the Delta and Temp are stored in a ROM block. At 860, if desired, steps 852-859 can be repeated for one or more OCSSs at different locations on the IC chip.

At 861, the strain measurement steps 852-860 are repeated at "burn". At 862, the final strain reading is calculated as the different between the differences (deltas) measured at "probe" and the strains measured at "burn".

Figure 9:
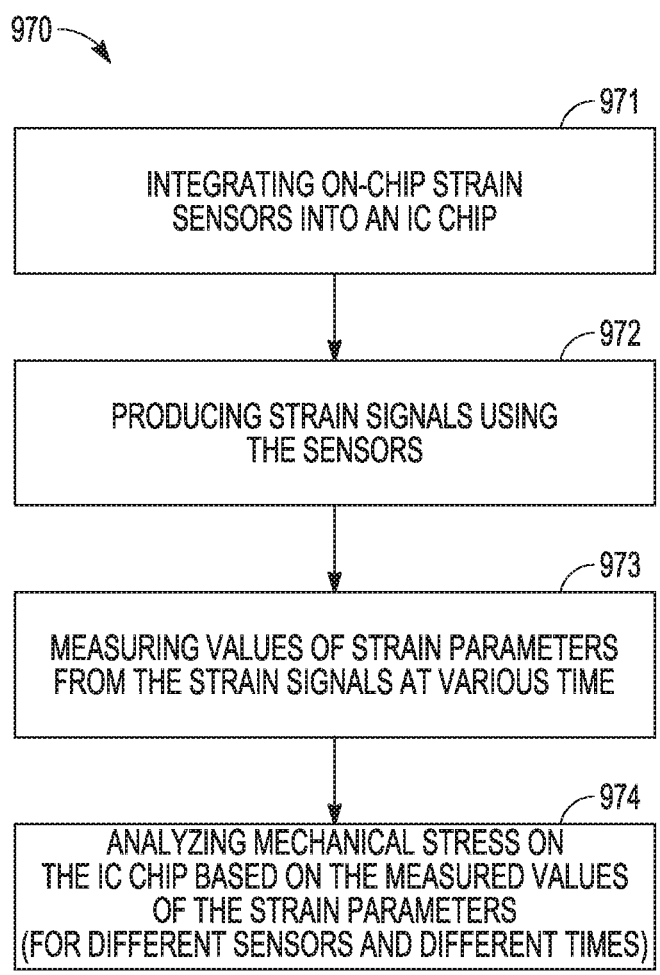
FIG. 9 is a flow chart illustrating an embodiment of a method for analyzing mechanical stress on a microelectronic chip device using one or more OCSSs.

FIG. 9 is a flow chart illustrating an embodiment of a method 970 for analyzing mechanical stress on a microelectronic chip device using one or more OCSSs. At 971, a plurality of OCSSs is integrated into an IC chip. At 972, strain signals are produced using the OCSSs to represent the strain sensed by the OCSSs from various locations on the IC chip.

At 973, values of a plurality of strain parameters are measured from the strain signals at various times. The plurality of strain parameters represents the strains sensed the plurality of OCSSs. In one embodiment, the strain parameters are measured using strain measurement circuit 104, including its various examples as discussed in this document.

At 974, the mechanical stress is analyzed based on the measured values of the strain parameters. In various embodiments, the measured values being analyzed can include values of different strain parameters selected from the plurality of strain parameters representing the strains sensed the plurality of OCSSs at various locations on the IC chip and/or values of each strain parameter measured at different times (e.g., corresponding different stages of manufacturing and/or usage). In one embodiment, the analysis is performed by strain analysis circuit 106 as discussed in this document.

In various embodiments, a plurality of strain parameters can be measured from a wafer including a plurality of dice. The strain parameters are measured from different dice of the plurality of dice of the wafer. A spatial distribution of the strain can be produced for the wafer.

In various embodiments, a plurality of strain parameters can be measured from a lot including a plurality of wafers. The strain parameters are measured from different wafers of the plurality of wafers of the lot. A distribution of the strain across the wafers can be produced for the lot to allow for comparison of strains between wafers of the lot.

In various embodiments, a plurality of strain parameters can be measured from a plurality of lots each including a plurality of wafers. The strain parameters are measured from different lots of the plurality of lots. A distribution of the strain. across the lots can be produced for the plurality of lots to allow for comparison of strains between the lots.

In various embodiments, values of a strain parameter over time can be measured and recorded to monitor the same strain parameter over time and events. Such a strain parameter for represent the strain for a location on a die, for a die on a wafer, for a wafer of a lot, or for a lot of a plurality of lots. The recorded values can be reported upon request.

In various embodiments, a potential customer-mode access is provided to allow a user of the IC to continue monitoring mechanical strain on the IC chip. This can allow the user to analyze mechanical stress on the IC chip during its operation in an electronic device in which the IC chip is used.

In various embodiments, peak values of each strain parameter are detected and recorded. The peak values may be analyzed to indicate abnormal conditions during manufacturing and use, including customer mishandling of the IC chip.

Some non-limiting examples (Examples 1-43) of the present subject matter are provided as follows:

In Example 1, a microelectronic chip device may include a semiconductor substrate having edges and corners, multiple on-chip strain sensors (OCSSs), and a strain measurement circuit. The OCSSs are constructed on the substrate at various locations of the substrate. At least one of the OCSSs may include multiple piezoresistive devices configured to sense a strain at a location of the OCSS and to produce a strain signal representing the strain at that location. The multiple piezoresistive devices may include at least a complementary pair of N-type and P-type semiconductor resistors. The strain measurement circuit may be constructed on the semiconductor substrate and configured to measure strain parameters from the strain signals produced by the OCSSs. The strain parameters represent the strains at the various locations.

In Example 2, the subject matter of Example 1 may optionally be configured such that the OCSSs are distributed along one or more edges of the edges of the substrate and proximate one or more corners of the corners of the substrate, and may optionally be configured to further include a strain analysis circuit constructed on the semiconductor substrate and configured to receive the measured strain parameters and analyze mechanical stress on the device by processing strain parameters selected from the measured strain parameters to represent the strains at two or more locations of the various locations.

In Example 3, the subject matter of Example 2 may optionally be configured such that the strain analysis circuit is further configured to analyze the mechanical stress on the device based on the selected strain parameters measured at various conditions.

In Example 4, the subject matter of any one or any combination of Examples 1 to 3 may optionally be configured such that the OCSSs are distributed in locations on the substrate where maximum strain is anticipated during manufacturing of the device.

In Example 5, the subject matter of any one or any combination of Examples 1 to 4 may optionally be configured such that the multiple OCSSs include pair of OCSSs placed adjacent each other, and each OCSS includes multiple piezoresistive devices configured to sense a strain.

In Example 6, the subject matter of any one or any combination of Examples 1 to 5 may optionally be configured to further include a multiplexer coupled between the strain measurement circuit and the multiple piezoresistive devices of one or more OCSSs, and may optionally be configured such that the strain measurement circuit is configured to produce the strain signal by sensing from one or more piezoresistive devices selected from the multiple piezoresistive devices at a time.

In Example 7, the subject matter of Example 6 may optionally be configured such that the multiple piezoresistive devices includes a third piezoresistive device, and the strain measurement circuit is configured to sense from the complementary pair of N-type and P-type semiconductor resistors for producing the strain signal with a desired amplitude; and from the third piezoresistive device for producing the strain signal with a desired granularity.

In Example 8, the subject matter of any one or any combination of Examples 1 to 7 may optionally be configured such that the strain measurement circuit includes an oscillator and a counter. The oscillator is configured to be driven by a strain signal of one or more of the strain signals produced by the OCSSs to generate an oscillation signal having a frequency being a function of the driving strain signal. The counter is configured to measure the frequency and produce a strain parameter of the measured strain parameters based on the frequency.

In Example 9, the subject matter of any one or any combination of Examples 1 to 8 may optionally be configured such that the strain measurement circuit includes a voltage amplifier to amplify one or more of the strain signals produced by the OCSSs prior to the measurement of the strain parameters.

In Example 10, the subject matter of any one or any combination of Examples 1 to 9 may optionally be configured such that the microelectronic chip device is a memory device including a memory circuit constructed on the substrate.

In Example 11, a microelectronic chip device may include a semiconductor substrate having edges and corners; multiple on-chip strain sensors (OCSSs), and a strain measurement circuit. The OCSSs are constructed on the substrate at various locations of the substrate. The OCSSs may each include one or more piezoresistive devices configured to sense a strain at a location of the various locations and produce a strain signal representing the strain at that location. The strain measurement circuit may be constructed on the semiconductor substrate and may be configured to measure strain parameters using the strain signals. The strain measurement circuit may include an oscillator and a counter. The oscillator may be configured to be driven by a strain signal of the strain signals produced by the OCSSs to generate an oscillation signal having a frequency being a function of the driving strain signal. The counter may be configured to measure the frequency of the oscillation signal and produce a strain parameter of the measured strain parameters based on the frequency.

In Example 12, the subject matter of Example 11 may optionally be configured such that the counter is configured to produce the strain parameter with a resolution finer than one part per million (PPM).

In Example 13, the subject matter of any one or any combination of Examples 11 and 12 may optionally be configured such that the OCSSs are distributed along one or more edges of the substrate and at one or more corners of the substrate, and may optionally be configured to further include a strain analysis circuit constructed on the semiconductor substrate and configured to receive the measured strain parameters and analyze mechanical stress on the device by processing strain parameters selected from the measured strain parameters to represent the strains at two or more locations of the various locations.

In Example 14, the subject matter of Example 13 may optionally be configured such that the strain analysis circuit is further configured to analyze the mechanical stress on the device based on the selected strain parameters measured at various times.

In Example 15, the subject matter of any one or any combination of Examples 11 to 14 may optionally be configured such that the OCSSs are distributed in locations on the substrate where maximum strain is anticipated during manufacturing of the device.

In Example 16, the subject matter of any one or any combination of Examples 11 to 15 may optionally be configured such that the OCSSs include one or more pairs of OCSSs placed adjacent each other.

In Example 17, the subject matter of any one or any combination of Examples 11 to 16 may optionally be configured such that the OCSSs each include multiple piezoresistive devices, may optionally be configured to further include a multiplexer constructed on the semiconductor substrate and coupled between the strain measurement circuit and the multiple piezoresistive devices of each OCSS of the multiple OCSSs, and may optionally be configured such that the strain measurement circuit is configured to produce the strain signal by sensing from one or more piezoresistive devices selected from the multiple piezoresistive devices at a time.

In Example 18, the subject matter of any one or any combination of Examples 11 to 17 may optionally be configured such that the microelectronic chip device is a memory device including a memory circuit constructed on the substrate.

In Example 19, a system for analyzing mechanical stress on an integrated circuit (IC) chip may include multiple on-chip strain sensors (OCSSs), a strain measurement circuit, and a strain analysis circuit. The OCSSs may be constructed on the IC chip and configured to sense a strain from a portion of the IC chip and to produce a strain signal representing the sensed strain. The strain measurement circuit may be constructed on the IC chip and configured to measure values of strain parameters at various times. The strain parameters each represent the strain sensed by an OCSS of the multiple OCSSs. The strain analysis circuit may be constructed on the IC chip and configured to receive the measured values of strain parameters and to perform an analysis of the mechanical stress by processing values of the strain parameters measured from the strain signals produced by different OCSSs of the multiple OCSSs at the various times.

In Example 20, the subject matter of Example 19 may optionally be configured such that the strain analysis circuit is further configured to store an outcome of the analysis of the mechanical stress in the IC chip for reporting upon request.

In Example 21, the subject matter of any one or any combination of Examples 19 and 20 may optionally be configured such that the strain analysis circuit is further configured to perform the analysis of the mechanical stress before and after packaging of the IC chip.

In Example 22, the subject matter of any one or any combination of Examples 19 to 21 may optionally be configured such that the strain measurement circuit is coupled to the multiple OCSSs through a multiplexer to allow for measurement of the strain signals produced by the OCSSs one at a time.

In Example 23, the subject matter of any one or any combination of Examples 19 to 22 may optionally be configured such that the strain measurement circuit includes an oscillator and a counter. The oscillator is configured to be driven by a strain signal of the strain signals produced by the OCSSs to generate an oscillation signal having a frequency being a function of the driving strain signal. The counter is configured to measure the frequency and produce a strain parameter of the measured strain parameters based on the frequency.

In Example 24, the subject matter of any one or any combination of Examples 19 to 22 may optionally be configured such that the OCSSs each include a complementary pair of N-type and P-type semiconductor resistors, and the strain measurement circuit includes a voltage amplifier configured to amplify each strain signal of the strain signals produced by the OCSSs.

In Example 25, the subject matter of any one or any combination of Examples 19 to 24 may optionally be configured such that strain measurement circuit is configured to measure the event values of each of the strain parameters before and after each specified event during manufacturing of the IC chip, and the strain analysis circuit is configured to perform the analysis of the mechanical stress using at least the measured event values.

In Example 26, the subject matter of any one or any combination of Examples 19 to 25 may optionally be configured such that strain measurement circuit is configured to measure the complementary values of each of the strain parameters while a tensile force is applied to the IC chip and while a compressive force is applied to the IC chip, and the strain analysis circuit is configured to perform the analysis of the mechanical stress using at least the measured complementary values.

In Example 27, the subject matter of any one or any combination of Examples 19 to 26 may optionally be configured such that strain measurement circuit is configured to measure the temperature values of each of the strain parameters at different temperatures, and the strain analysis circuit is configured to perform the analysis of the mechanical stress using at least the measured temperature values.

In Example 28, a method for analyzing mechanical stress on integrated circuit (IC) chips is provided. The method may include integrating multiple on-chip strain sensors (OCSSs) into each of multiple IC chips. The OCSSs may each be configured to sense a strain from a portion of the respective IC chip into which it is integrated and to produce a strain signal representing the sensed strain. The method may further include measuring values of multiple strain parameters from the strain signals at various times. The multiple strain parameters represent the strains sensed the multiple OCSSs. The method may further include analyzing the mechanical stress based on the measured values of the strain parameters. The measured values may include values of different strain parameters selected from the multiple strain parameters and values of a strain parameter measured at different times. The strain parameter are selected from the multiple strain parameters.

In Example 29, the subject matter of measuring the values of the multiple strain parameters from the strain signals as found in Example 28 may optionally include driving an oscillator using each strain signal of the strain signals to produce an oscillation signal having a frequency and using a counter to detect the frequency as the strain parameter measured from the each strain signal.

In Example 30, the subject matter of Example 28 may optionally further include constructing at least one OCSS of the multiple OCSSs to include a complementary pair of N-type and P-type semiconductor resistors for increasing amplitude of the strain signal.

In Example 31, the subject matter of constructing the at least one OCSS as found in Example 28 may optionally further include including a third semiconductor resistor in the OCSS for increasing granularity of the strain signal.

In Example 32, the subject matter of measuring the values of the multiple strain parameters from the strain signals as found in any one or any combination of Examples 30 and 31 may optionally include amplifying the strain signal using a voltage amplifier.

In Example 33, the subject matter of measuring the values of the multiple strain parameters from the strain signals as found in any one or any combination of Examples 28 to 32 may optionally include measuring the values of the multiple strain parameters from the strain signals representing the strains sensed before and after each specified event during manufacturing of the IC chips.

In Example 34, the subject matter of measuring the values of the multiple strain parameters from the strain signals as found in any one or any combination of Examples 28 to 33 may optionally include measuring the values of the multiple strain parameters from the strain signals representing the strains sensed while a tensile force is applied to the IC chip and while a compressive three is applied to the IC chip.

In Example 35, the subject matter of measuring the values of the multiple strain parameters from the strain signals as found in any one or any combination of Examples 28 to 34 may optionally include measuring the values of the multiple strain parameters from the strain signals representing the strains sensed at different temperatures.

In Example 36, the subject matter of any one or any combination of Examples 28 to 35 may optionally further include repeating the measuring and analyzing for multiple IC chips from a wafer and producing a spatial distribution of the strains for the wafer.

In Example 37, the subject matter of Example 36 may optionally further include repeating the measuring and analyzing for multiple the wafers from a lot and producing a distribution of the strains across the wafers for the lot.

In Example 38, the subject matter Example 37 may optionally further include repeating the measuring and analyzing for multiple lots and producing a distribution of the strains across the lots for the multiple lots.

In Example 39, the subject matter of any one or any combination of Examples 28 to 38 may optionally further include providing the IC chips with a customer-mode access allowing a user of the one of the IC chips to monitor the mechanical stress on the IC chip after the IC chips are manufactured.

In Example 40, the subject matter of analyzing the mechanical stress as found in any one or any combination of Examples 28 and 39 may optionally further include detecting peak values of each strain parameter of the multiple strain parameters and detecting abnormal conditions based on the detected peak values.

In Example 41, the subject matter of detecting the abnormal conditions as found in Example 40 may optionally include detecting abnormal conditions experienced by individual chips of the IC chips during manufacturing of the IC chips.

In Example 42, the subject matter of detecting the abnormal conditions as found in any one or any combination of Examples 40 and 41 may optionally further include detecting abnormal conditions experienced by the IC chips during application of respective IC chips by a customer after the manufacturing of the IC chips.

In Example 43, the subject matter of any one or any combination of Examples 28 to 42 may optionally further include storing an outcome of the analysis of the mechanical stress for the each chip in the each chip and reporting the stored outcome from the each chip upon request.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim, standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronic chip device, comprising:
   a semiconductor substrate having edges and corners;
   multiple on-chip strain sensors (OCSSs) constructed on the semiconductor substrate at various locations of the semiconductor substrate, at least one of the OCSSs including multiple piezoresistive devices configured to sense a strain at a location of the OCSS and to produce a strain signal representing the strain at that location, the multiple piezoresistive devices including at least a complementary pair of N-type and P-type semiconductor resistors; and
   a strain measurement circuit constructed on the semiconductor substrate and configured to measure strain parameters from the strain signals produced by the OCSSs, the strain parameters representing the strains at the various locations.

2. The device of claim 1, wherein the OCSSs are distributed along one or more edges of the edges of the semiconductor substrate and proximate one or more corners of the corners of the semiconductor substrate, and further comprising a strain analysis circuit constructed on the semiconductor substrate and configured to receive the measured strain parameters and analyze mechanical stress on the device by processing strain parameters selected from the measured strain parameters to represent the strains at two or more locations of the various locations.

3. The device of claim 2, wherein the strain analysis circuit is further configured to analyze the mechanical stress on the device based on the selected strain parameters measured at various conditions.

4. The device of claim 3, wherein the OCSSs are distributed in locations on the semiconductor substrate where maximum strain is anticipated during manufacturing of the device.

5. The device of claim 3, wherein the multiple OCSSs comprise pair of OCSSs placed adjacent each other, and wherein each OCSS includes multiple piezoresistive devices configured to sense a strain.

6. The device of claim 3, further comprising a multiplexer coupled between the strain measurement circuit and the multiple piezoresistive devices of one or more OCSSs, and wherein the strain measurement circuit is configured to produce the strain signal by sensing from one or more piezoresistive devices selected from the multiple piezoresistive devices at a time.

7. The device of claim 6, wherein the multiple piezoresistive devices comprises a third piezoresistive device, and wherein the strain measurement circuit is configured to sense from the complementary pair of N-type and P-type semiconductor resistors for producing the strain signal with a desired amplitude and from the third piezoresistive device for producing the strain signal with a desired granularity.

8. A microelectronic chip device, comprising:
a semiconductor substrate having edges and corners;
multiple on-chip strain sensors (OCSSs) constructed on the semiconductor substrate at various locations of the semiconductor substrate, the OCSSs each including one or more piezoresistive devices configured to sense a strain at a location of the various locations and produce a strain signal representing the strain at that location; and
a strain measurement circuit constructed on the semiconductor substrate and configured to measure strain parameters using the strain signals, the strain measurement circuit including:
an oscillator configured to be driven by a strain signal of the strain signals produced by the OCSSs to generate an oscillation signal having a frequency being a function of the driving strain signal; and
a counter configured to measure the frequency of the oscillation signal and produce a strain parameter of the measured strain parameters based on the frequency.

9. The device of claim 8, wherein the OCSSs are distributed along one or more edges of the semiconductor substrate and at one or more corners of the semiconductor substrate, and further comprising a strain analysis circuit constructed on the semiconductor substrate and configured to receive the measured strain parameters and analyze mechanical stress on the device by processing strain parameters selected from the measured strain parameters to represent the strains at, two or more locations of the various locations.

10. The device of claim 9, wherein the strain analysis circuit is further configured to analyze the mechanical stress on the device based on the selected strain parameters measured at various times.

11. The device of claim 10, wherein the OCSSs are distributed in locations on the semiconductor substrate where maximum strain is anticipated during manufacturing of the device.

12. The device of claim 10 herein the OCSSs comprise one or more pairs of OCSSs placed adjacent each other.

13. The device of claim 10, wherein the OCSSs each comprise multiple piezoresistive devices, and further comprises a multiplexer constructed on the semiconductor substrate and coupled between the strain measurement circuit and the multiple piezoresistive devices of each OCSS of the multiple OCSSs, and wherein the strain measurement circuit is configured to produce the strain signal by sensing from one or more piezoresistive devices selected from the multiple piezoresistive devices at a time.

14. A system for analyzing mechanical stress on an integrated circuit (IC) chip, the system comprising:
multiple on-chip strain sensors (OCSSs) constructed on the IC chip and configured to sense a strain from a portion of the IC chip and to produce a strain signal representing the sensed strain;
a strain measurement circuit constructed on the IC chip and configured to measure values of strain parameters at various times, the strain parameters each representing the strain sensed by an OCSS of the multiple OCSSs; and
a strain analysis circuit constructed on the IC chip and configured to receive the measured values of strain parameters and perform an analysis of the mechanical stress by processing values of the strain parameters measured from the strain signals produced by different OCSSs of the multiple OCSSs at the various times.

15. The system of claim 14, wherein strain measurement circuit is configured to measure the event values of each of the strain parameters before and after each specified event during manufacturing of the IC chip, and the strain analysis circuit is configured to perform the analysis of the mechanical stress using at least the measured event values.

16. The system of claim 14, wherein strain measurement circuit is configured to measure the complementary values of each of the strain parameters while a tensile force is applied to the IC chip and while a compressive force is applied to the IC chip, and the strain analysis circuit is configured to perform the analysis of the mechanical stress using at least the measured complementary values.

17. The system of claim 14, wherein strain measurement circuit is configured to measure the temperature values of each of the strain parameters at different temperatures, and the strain analysis circuit is configured to perform the analysis of the mechanical stress using at least the measured temperature values.

18. A method for analyzing mechanical stress on integrated circuit (IC) chips, the method comprising:
integrating multiple on-chip strain sensors (OCSSs) into each of multiple IC chips, the OCSSs each configured to sense a strain from a portion of the respective IC chip into which it is integrated and to produce a strain signal representing the sensed strain;
measuring values of multiple strain parameters from the strain signals at various times using a strain measurement circuit constructed on each of the multiple IC chips, the multiple strain parameters representing the strains sensed by the multiple OCSSs; and
analyzing the mechanical stress using a strain analysis circuit constructed on each of the multiple IC chips based on the measured values of the strain parameters, the measured values including values of different strain parameters selected from the multiple strain parameters and values of a strain parameter measured at different times, the strain parameter selected from the multiple strain parameters.

19. The method of claim 18, further comprising:
repeating the measuring and analyzing for multiple IC chips from a wafer; and
producing a spatial distribution of the strains for the wafer.

20. The method of claim 19, further comprising:
repeating the measuring and analyzing for multiple the waters from a lot; and
producing a distribution of the strains across the wafers for the lot.

21. The method of claim 20, further comprising:
repeating the measuring and analyzing for multiple lots; and
producing a distribution of the strains across the lots for the multiple lots.

22. The method of claim 18, further comprising providing the IC chips with a customer-mode access allowing a user of the one of the IC chips to monitor the mechanical stress on the IC chip after the IC chips are manufactured.

23. The method of claim 18, wherein analyzing the mechanical stress comprises:
detecting peak values of each strain parameter of the multiple strain parameters; and
detecting abnormal conditions based on the detected peak values.

24. The method of claim 23, wherein detecting the abnormal conditions comprises detecting abnormal conditions experienced by individual chips of the IC chips during manufacturing of the IC chips.

25. The method of claim 24, wherein detecting the abnormal conditions comprises detecting abnormal conditions experienced by the IC chips during application of respective IC chips by a customer after the manufacturing of the IC chips.

\* \* \* \* \*

UNITED STATES PATENT AND TRADEMARK OFFICE
CERTIFICATE OF CORRECTION

PATENT NO. : 11,189,536 B2  
APPLICATION NO. : 16/294469  
DATED : November 30, 2021  
INVENTOR(S) : Marr et al.

Page 1 of 1

It is certified that error appears in the above-identified patent and that said Letters Patent is hereby corrected as shown below:

In the Claims

In Column 17, Line 51, in Claim 9, delete "at," and insert --at-- therefor

In Column 17, Line 61, in Claim 12, delete "claim 10 herein" and insert --claim 10, wherein-- therefor In Column 19, Line 3, in Claim 20, delete "waters" and insert --wafers-- therefor Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*